US009324800B1

(12) United States Patent
Ku et al.

(10) Patent No.: US 9,324,800 B1
(45) Date of Patent: Apr. 26, 2016

(54) BIDIRECTIONAL MOSFET WITH SUPPRESSED BIPOLAR SNAPBACK AND METHOD OF MANUFACTURE

(71) Applicant: FREESCALE SEMICONDUCTOR, INC., Austin, TX (US)

(72) Inventors: Pon Sung Ku, Gilbert, AZ (US); Edouard D. De Frèsart, Tempe, AZ (US); Ganming Qin, Chandler, AZ (US); Moaniss Zitouni, Gilbert, AZ (US); Dragan Zupac, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/619,232

(22) Filed: Feb. 11, 2015

(51) Int. Cl.
| | |
|---|---|
| *H01L 29/10* | (2006.01) |
| *H01L 29/423* | (2006.01) |
| *H01L 29/78* | (2006.01) |
| *H01L 29/66* | (2006.01) |

(52) U.S. Cl.
CPC ........ *H01L 29/1033* (2013.01); *H01L 29/4236* (2013.01); *H01L 29/66666* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 7,282,406 B2 | 10/2007 | Grivna et al. | |
| 7,297,603 B2 | 11/2007 | Robb et al. | |
| 7,537,970 B2 | 5/2009 | Robb et al. | |
| 7,910,409 B2 | 3/2011 | Robb et al. | |
| 8,101,969 B2 | 1/2012 | Robb et al. | |
| 8,431,989 B2 | 4/2013 | Bhalla et al. | |
| 8,723,238 B1* | 5/2014 | Padmanabhan | ....... H01L 29/407 257/288 |
| 9,048,214 B2* | 6/2015 | Padmanabhan | ....... H01L 29/404 |
| 2007/0004116 A1 | 1/2007 | Hshieh | |
| 2009/0045440 A1* | 2/2009 | Grivna | ............. H01L 29/42368 257/288 |
| 2012/0037920 A1* | 2/2012 | Treu | ................... H01L 29/0649 257/77 |
| 2012/0083075 A1 | 4/2012 | Robb et al. | |
| 2014/0252472 A1 | 9/2014 | Chen et al. | |

OTHER PUBLICATIONS

PCT Application No. PCT/IB2013/002209, filed on Aug. 27, 2013.

* cited by examiner

*Primary Examiner* — Joseph Schoenholtz
(74) *Attorney, Agent, or Firm* — Charlene R. Jacobsen

(57) ABSTRACT

A bidirectional trench FET device includes a semiconductor substrate, a trench in the substrate extending vertically from the surface of the substrate, and a body region laterally adjacent the trench. A source region is disposed in the semiconductor substrate between the body region and the surface of the substrate. A dielectric layer is disposed over the surface and a body electrode is disposed over the dielectric layer. A body contact plug extends through the dielectric layer to interconnect the body region with the body electrode, and the body contact plug is electrically isolated from the source region. Two separate metal layers are implemented to make multiple body and source contacts electrically isolated from one another throughout the active area of the device. The low resistive path by the body contact plug and the separate metal layers enables suppression of bipolar snapback without losing bidirectional switching capability.

20 Claims, 9 Drawing Sheets ns BIDIRECTIONAL MOSFET WITH
SUPPRESSED BIPOLAR SNAPBACK AND
METHOD OF MANUFACTURE

TECHNICAL FIELD OF THE INVENTION

The present invention relates generally to semiconductor devices. More specifically, the present invention relates to a bidirectional trench field effect transistor (FET) device with suppressed bipolar snapback.

BACKGROUND OF THE INVENTION

Integrated circuits (ICs) and other electronic devices often include arrangements of interconnected field effect transistor (FET) devices, also called metal-oxide-semiconductor field effect transistors (MOSFETs). A typical FET device includes a gate electrode as a control electrode, and spaced apart source and drain electrodes. A control voltage applied to the gate electrode controls the flow of current through a controllable conductive channel between the source and drain electrodes.

Power transistor devices are designed to be tolerant of the high currents and voltages that are present in switching applications that previously relied upon electromechanical switches. In a conduction (or ON) state, power transistor devices may handle currents that range from several Amperes to several hundred Amperes. The applications may also involve the power transistor devices blocking high voltages during an OFF state, e.g., 25 Volts or more, without breaking down. One type of power transistor device is a trench FET device. In trench FET devices, the gate electrode is disposed in a trench to form a vertical channel. Significant effort has been directed toward the formation of bidirectional trench FETs that are capable of switching high currents through their conduction electrodes while blocking high voltages applied to the conduction electrodes.

Some prior art bidirectional trench FET devices utilize a boron doped P-region body and a P+ link connects the P-region body to the P-body electrode. This process can be readily implemented. However, this process is not efficient at removing holes generated by impact ionization near the drain and body junction due to a high resistive path. The high resistive path of the P-body in parasitic bipolar induces bipolar snapback at lower impact ionization resulting in low blocking voltage and limited safe operating area (SOA). Therefore, a need exists in the art of bidirectional trench FET devices to resolve the above discussed problem.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

In overview, embodiments of the present invention entail a bidirectional trench field effect transistor (FET) device with suppressed bipolar snapback, along with a method of fabricating such a device. The bidirectional trench FET device includes one or more body contact plugs formed from, for example, tungsten, that make contact between a body region of the device and a body electrode. The body contact plug functions to remove holes generated by reverse biased avalanche from the body/drain junction. The body contact plug may be surrounded by a dielectric lining. The dielectric lining isolates the body contact plug from a source region of the bidirectional trench FET device. Isolation of the body contact plug from the source enables bidirectional switching. In addition, the bidirectional trench FET device includes two separate metal layers in order to make multiple body and source contacts separately throughout the active area of the bidirectional trench FET device. The low resistive paths formed by the body contact plugs to the metal body layer enables suppression of the bipolar snapback and isolation of the body metal contact from the source contact maintains the bidirectional switching capability.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

The illustrated examples may for the most part, be implemented using techniques, processes, and components known to those skilled in the art. Therefore, details will not be explained in any greater extent than that considered necessary for the understanding and appreciation of the underlying concepts of the examples set forth herein and in order not to obscure or distract from the teachings herein.

Figure 1:
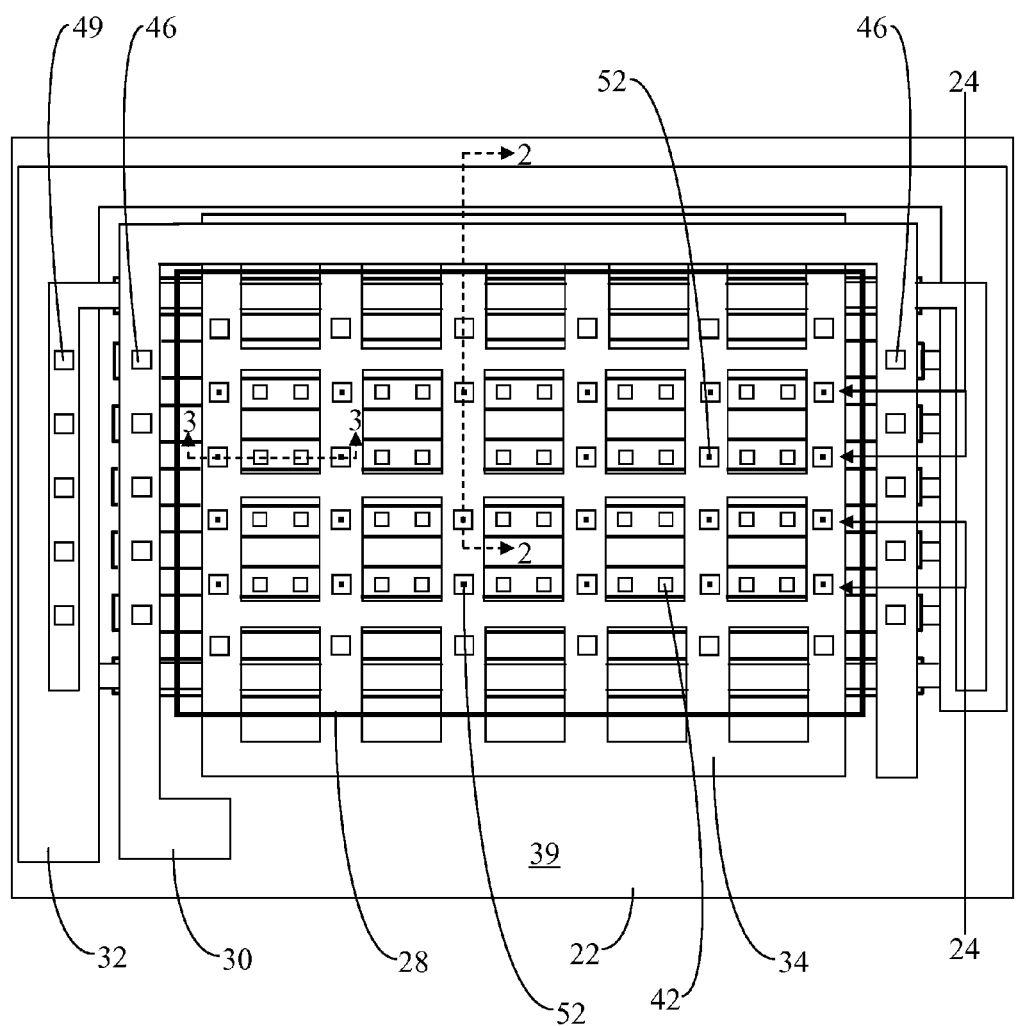
FIG. 1 shows a schematic plan view of a bidirectional trench field effect transistor (FET) device in accordance with an embodiment.
Figure 2:
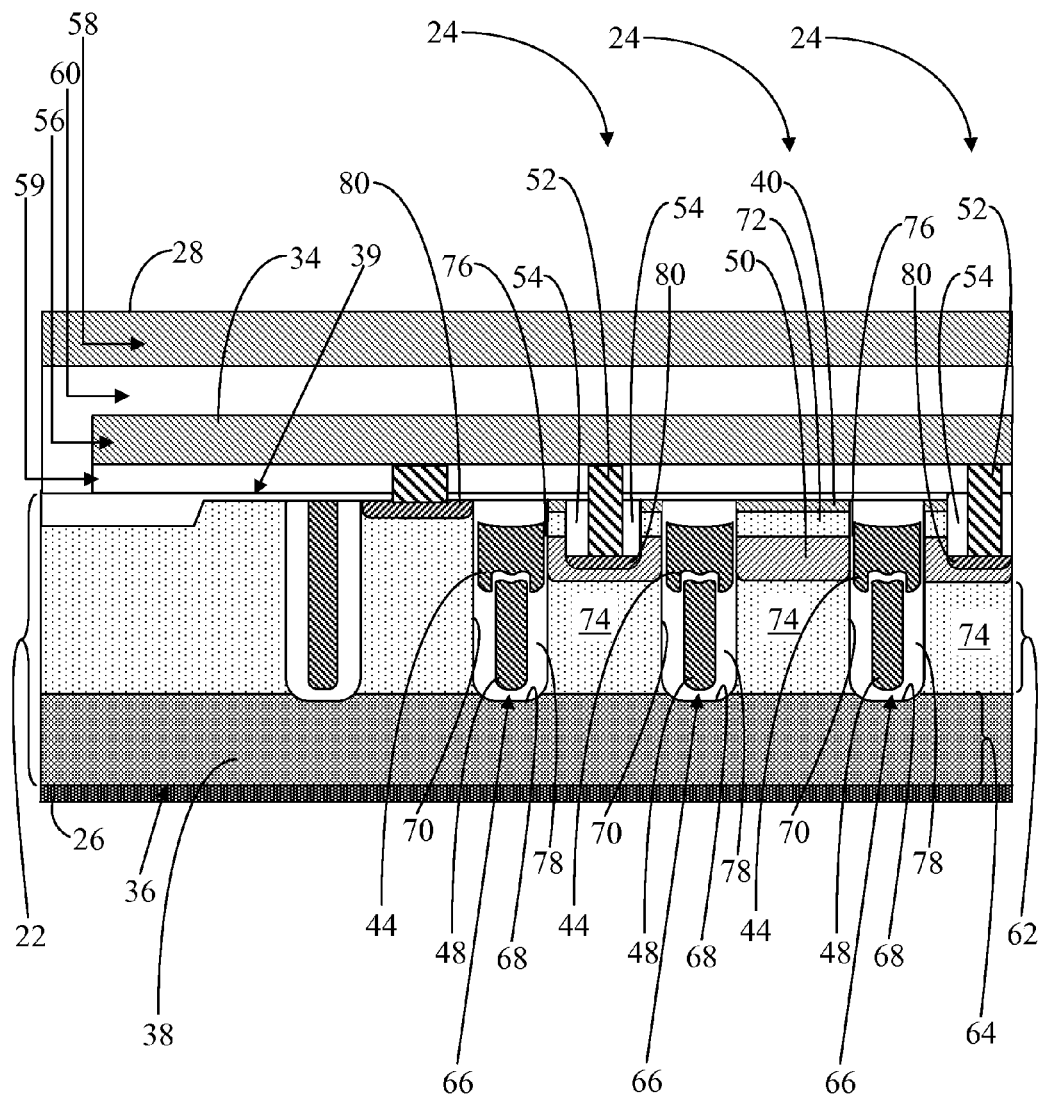
FIG. 2 shows a side sectional view of a part of the bidirectional trench FET device taken along section lines 2-2 of FIG. 1.
Figure 3:
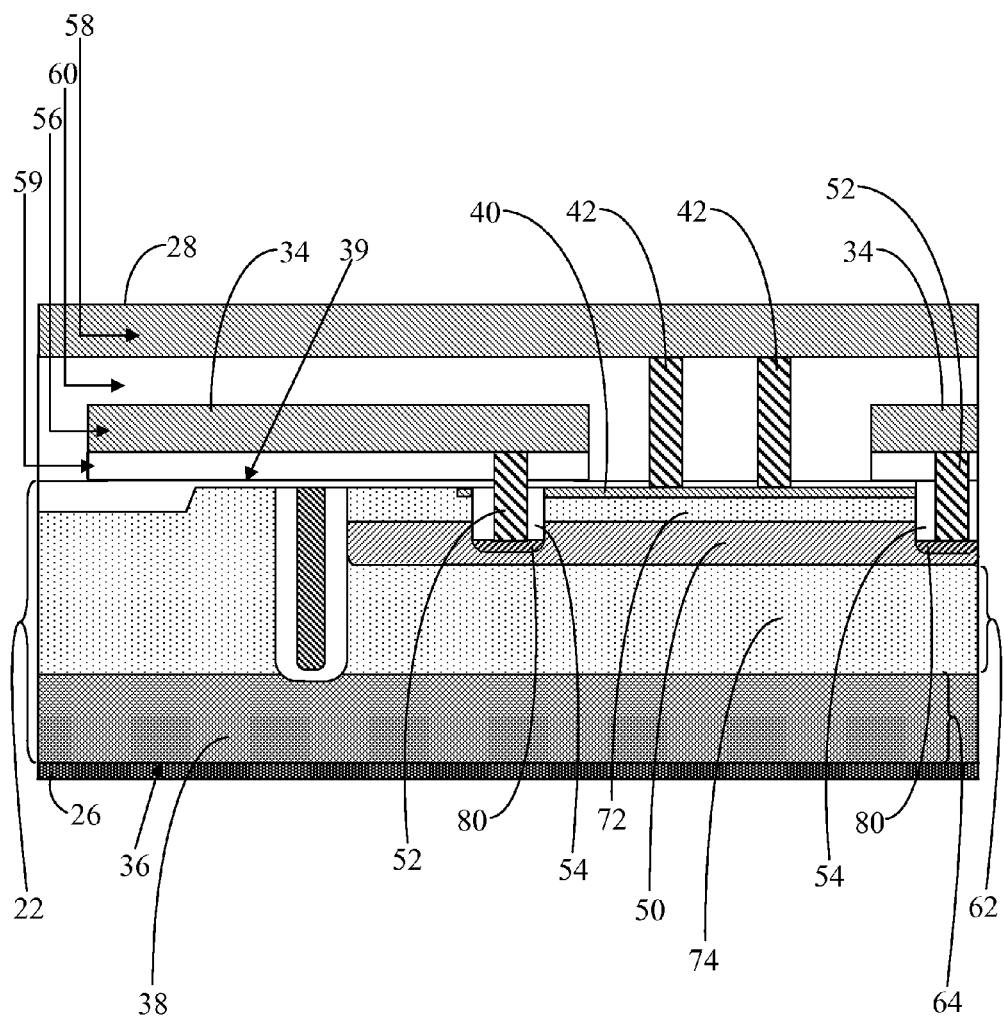
FIG. 3 shows a side sectional view of a part of the bidirectional trench FET device taken along section lines 3-3 of FIG. 1.

Referring to FIGS. 1-3, FIG. 1 shows a schematic plan view of a bidirectional trench field effect transistor (FET) device 20 in accordance with an embodiment. FIG. 2 shows a side sectional view of a part of bidirectional trench FET device 20 taken along section lines 2-2 of FIG. 1, and FIG. 3 shows a side sectional view of a part of bidirectional trench FET device 20 taken along section lines 3-3 of FIG. 1. Bidirectional trench FET device 20 includes a semiconductor substrate 22 in which a number of constituent transistors 24 are formed. Transistors 24 may be disposed adjacent to one another, and may share one or more components (e.g., gate structures, drain region). Transistors 24 may be connected in parallel with one another to establish a discrete bidirectional trench FET device 20. Depending upon the specific implementation, bidirectional trench field effect transistor (FET) device 20 may include several tens, hundreds, thousands, or more transistors 24 in a suitable arrangement.

The parallel connection of transistors 24 may involve a number of shared or interconnected electrodes 26, 28, 30, 32, 34. In this example, electrode 26 (visible in FIGS. 2-3) is a shared first current electrode, referred to herein as a drain electrode 26, extending over a bottom surface 36 of semiconductor substrate 22. Drain electrode 26 is connected to a first current terminal, referred to herein as a drain region 38 (visible in FIGS. 2-3). Electrodes 28, 30, 32, 34 may be formed over a top surface 39 of semiconductor substrate 22. Electrodes 28, 30, 32, 34, and top surface 39 may be covered by a passivation layer of a suitable dielectric material (not shown for clarity) to shield electrodes 28, 30, 32, 34, and top surface 39 from ambient influences, such as oxidations or otherwise.

In an embodiment, electrode 28 is a second current electrode, referred to hereinafter as a source electrode 28. Source electrode 28 is connected to a second current terminal, referred to herein as a source region 40 of each transistor 24 via source interconnects 42. Electrode 30 is referred to hereinafter as a gate electrode 30, and is connected to a gate 44 of each transistor 24 via gate interconnects 46. Electrode 32 is referred to hereinafter as a shield electrode 32, and is connected to shields 48 via shield interconnects 49.

Electrode 34 is referred to hereinafter as a body electrode 34. In accordance with a particular embodiment, body electrode 34 is connected to a body region 50 of at least some of transistors 24 via one or more body contact plugs 52. Body contact plugs 52 may be formed from tungsten, polysilicon, doped polysilicon, or any other suitable electrically conductive material. However, body contact plugs 52 are electrically isolated from source region 40. In an example, a body contact plug 52 can extend through source region 40. However, body contact plug 52 is surrounded by a dielectric lining 54 in order to electrically isolate body contact plug 52 from source region 40. As will be discussed in greater detail below, body contact plugs 52 are provided to remove holes generated by impact ionization, and the electrical isolation of each body contact plug 52 from source region 40 is provided to enable bi-directional switching.

In FIG. 1, source electrode 28 is shown in outline form in order to visualize the underlying elements. However, in practice, source electrode 28 may be formed as a contiguous metal sheet layer over the underlying elements. Furthermore, in FIG. 1, source interconnects 42 are represented by the empty square boxes (i.e., those boxes that do not contain smaller squares positioned within them) that are themselves positioned within the outline of source electrode 28. Additionally, body contact plugs 52 are represented by square boxes that contain smaller squares positioned within them. Bidirectional trench FET device 20 may include any number of body contact plugs 52 suitable for removing holes generated by impact ionization. FIG. 2 is particularly illustrated to show that one transistor 24 may not include a body contact plug 52, while adjacent transistors 24 may include body contact plug 52.

In accordance with an embodiment, body electrode 34 and source electrode 28 are formed in separate metal layers vertically displaced from one another. By way of example, body electrode 34 is formed in a first metal layer 56 and source electrode 28 is formed in a second metal layer 58. In this example, gate electrode 30 and shield electrode 32 are also formed in second metal layer 58. First metal layer 56 may be separated by and electrically isolated from top surface 39 of semiconductor substrate 22, and especially from source region 40 by a first interlayer dielectric (ILD) 59. In addition, first and second metal layers 56 and 58 are separated by and electrically isolated from one another via a second interlayer dielectric (ILD) 60. It should be readily observed in FIG. 3 that source interconnects 42 extend through second ILD 60. Thus, source interconnects 42 are electrically isolated from body contact plugs 52 and body electrode 34 via ILD's 59 and 60.

As more clearly visualized in FIGS. 2 and 3, body electrode 34 is in first metal layer 56 underlying source electrode 28 in second metal layer 58. However, in alternative embodiments, body electrode 34 may be formed in a second metal layer overlying source electrode 28 formed in a first metal layer. Two separate metal layers, i.e., first and second metal layers 56 and 58, are implemented to make multiple contacts to body region 50 and to source region 40 separately throughout the entire active area (i.e., the area circumscribed by the outline of source electrode 28). The multiple contacts to body region 50 via body contact plugs 52 results in a low resistive path to facilitate suppression of bipolar snapback.

FIGS. 1-3 and subsequent FIGS. 4-6 and 8-13 are illustrated using various shading and/or hatching to distinguish the different elements of bidirectional trench FET device 20. These different elements within the structural layers may be produced utilizing current and upcoming micromachining techniques. Additionally, any electrically isolating dielectric materials identified in FIGS. 1-3 and subsequent FIGS. 4-6 and 8-13 are not shaded or hatched in order to better visualize their placement relative to the elements of FET device 20. It should be further understood that the use of relational terms, if any, such as first and second, top and bottom, and the like are used solely to distinguish one from another entity or action without necessarily requiring or implying any actual such relationship or order between such entities or actions.

Semiconductor substrate 22 may include a number of epitaxial layers 62 supported by an original substrate 64. In this example, semiconductor substrate 22 includes a single n-type epitaxial layer 62, and original substrate 64 may be an n-type heavily or moderately doped substrate. Epitaxial layer 62 and original substrate 64 are not necessarily drawn to scale in FIGS. 2-3. For example, in some cases, original substrate 64 may be thinned from an initial thickness after growth of epitaxial layer(s) 62 and other fabrication procedures. The structural, material, and other characteristics of semiconductor substrate 22 may vary from the example shown. For example, additional, fewer, or alternative layers may be included in semiconductor substrate 22.

Each transistor 24 includes one or more trenches 66 in semiconductor substrate 22, having a depth that may correspond roughly with the thickness of epitaxial layer 62. In the example of FIGS. 1-3, each transistor 24 may be considered to include a pair of trenches 66. Each transistor 24 may thus share a trench 66 with adjacent transistors 24 on either lateral side thereof. Each trench 66 extends vertically from top surface 39 to a bottom 68. In this example, sidewalls 70 extend in parallel downward from top surface 39.

Each transistor 24 includes body region 50 disposed in semiconductor substrate 22 between a respective pair of adjacent trenches 66. A channel is formed in each region of body 50 during operation for conduction of charge carriers between source electrode 28 and drain electrode 26. In this n-channel example, body regions 50 include p-type regions, and more particularly, boron doped P-regions. As particularly shown in FIG. 2, the p-type doping of semiconductor substrate 22 in body regions 50 may span across the entire lateral spacing between sidewalls 70 of adjacent trenches 66. Each body region 50 may be a uniform doped region, or include one or more constituent or additional regions between adjacent trenches 66. For example, additional implantation and/or epitaxial growth procedures may be used to define a non-uniform body region.

Each transistor 24 of bidirectional trench FET device 20 includes an upper drift region 72 and a lower drift region 74. Upper drift region 72 is disposed in semiconductor substrate 22 between body region 50 and top surface 39. Lower drift region 74 is disposed in semiconductor substrate 22 between body region 50 and bottom surface 36. In this example, upper and lower drift regions 72, 74 are n-type regions. In some cases, one or both of upper and lower drift regions 72, 74 correspond with respective portions of epitaxial layer 62. In other cases, one or both of upper and lower drift regions 72, 74 have been additionally doped. The additional doping may be of either conductivity type.

Together with body region 50, upper and lower drift regions 72, 74 define a conduction path of each transistor 24. In a forward conduction mode, the conduction path begins with charge carriers drifting through upper drift region 72 under the influence of the drain 38/source 40 bias voltage. The flow of charge carriers proceeds in the opposite direction in the reverse conduction mode. In this example, each of upper and lower drift regions 72, 74 has a uniform dopant concentration profile. However, the dopant concentration profile and other characteristics of upper and lower drift regions 72, 74 may vary.

Bidirectional trench FET device 20 can include a plurality of gates 44, where each gate 44 is disposed in a respective one of trenches 66. Gates 44 may be recessed or buried within trenches 66 relative to top surface 39. Each of gates 44 may be shared by two adjacent transistors 24. Each gate 44 is disposed at a depth to be positioned alongside body regions 50 of the adjacent transistors 24. A control voltage is applied to gates 44 to control formation of the channels in body regions 50 during operation. For example, the control voltage is applied to gates 44 through gate electrode 30 and gate interconnects 46.

When gates 44 are biased, charge carriers (for example, electrons) accumulate in body regions 50 on either side of gates 44. The charge carriers may accumulate along lateral sides of body regions 50 facing gates 44. In this example, the accumulation of electrons results in a charge inversion in body region 50 from the P-type body region 50 to an n-type channel near and along the lateral sides of body region 50. Once a sufficient amount of the charge carriers accumulate in the channel, charge carriers are capable of flowing from source region 40 toward drain region 38 through the channel.

Bidirectional trench FET device 20 includes a gate dielectric layer 76 disposed along sidewalls 70 of each of trenches 66 between gates 44 and body regions 50. In this example, each of transistors 24 may thus be considered to include a pair of gate dielectric layers 76, one pair for each gate 44. Gate dielectric layers 76 may include silicon dioxide and/or any other dielectric material. Each gate 44 is spaced from body region 50 by gate dielectric layer 76. Each gate 44 may thus span the lateral distance between gate dielectric layers 76 on sidewalls 70. The thickness of gate dielectric layers 76 may vary in accordance with the operating voltages applied to source and drain electrodes 28, 26, and/or the magnitude of the control voltage applied to gates 44.

Bidirectional trench FET device 20 can further include a plurality of shields 48 disposed in trenches 66. Each shield 48 is disposed below, and spaced from, gate 44 in the respective trench 66. Each shield 48 is thus disposed alongside a respective one of lower drift regions 74. Additionally, a shield dielectric layer 78 is disposed in trench 66 at sidewalls 70 on each lateral side of shield 48. Each shield 48 may thus be spaced from lower drift region 74 by shield dielectric layer 78. Shields 48 may be or may include a polysilicon structure, although alternative conductive materials may be used.

Shields 48 may be biased during operation to create an accumulation region in lower drift region 74. For example, a positive voltage applied to shields 48 via shield electrode 32 and shield interconnects 49 can cause electrons to accumulate in lower drift region 74. The presence of the accumulation region in lower drift region 74 may increase the switching speed of bidirectional trench FET device 20. During operation, shields 48 may also be biased to provide a RESURF effect in lower drift region 74.

Source region 40 of each transistor 24, in this example, is a heavily doped (N+) source region 40 disposed in semiconductor substrate 22 at top surface 39. Each source region 40 is disposed between upper drift region 72 of each transistor 24 and top surface 39 of semiconductor substrate 22. Drain region 38, shared by each of transistors 24, is disposed between lower drift region 74 and bottom surface 36 of semiconductor substrate 22. In this example, source region 40 and drain region 38 are n-type doped portions of epitaxial layer 62 and original substrate 64, respectively. Source region 40 and drain region 38 may be biased for bidirectional operation in either a forward or reverse conduction mode. In the forward conduction mode, drain 38 is biased higher than source region 40. In the reverse conduction mode, source region 40 is biased higher than drain 38.

Source region 40 and drain region 38 are vertically spaced from one another as shown in the cross-section of FIG. 2. The spacing defines the conduction path of transistor 24. Any number of source regions 40 or drain regions 38 may be provided and other source/drain arrangements may be used.

As mentioned previously, some transistors 24 may include a body contact plug 52 surrounded by dielectric lining 54. In this example, body contact plug 52 extends through first ILD 59, through source region 40, and through upper drift region 72 to interconnect body region 50 with body electrode 34. Again, dielectric lining 54 electrically isolates body contact plug 52 from source region 40. In some embodiments, a dopant region 80 may be disposed between body contact plug 52 and body region 50. By way of example, body region 50 comprises a P-region and dopant region 80 comprises a highly doped P+ region formed by, for example, implantation and activation of a p-type dopant, such as boron.

Figure 4:
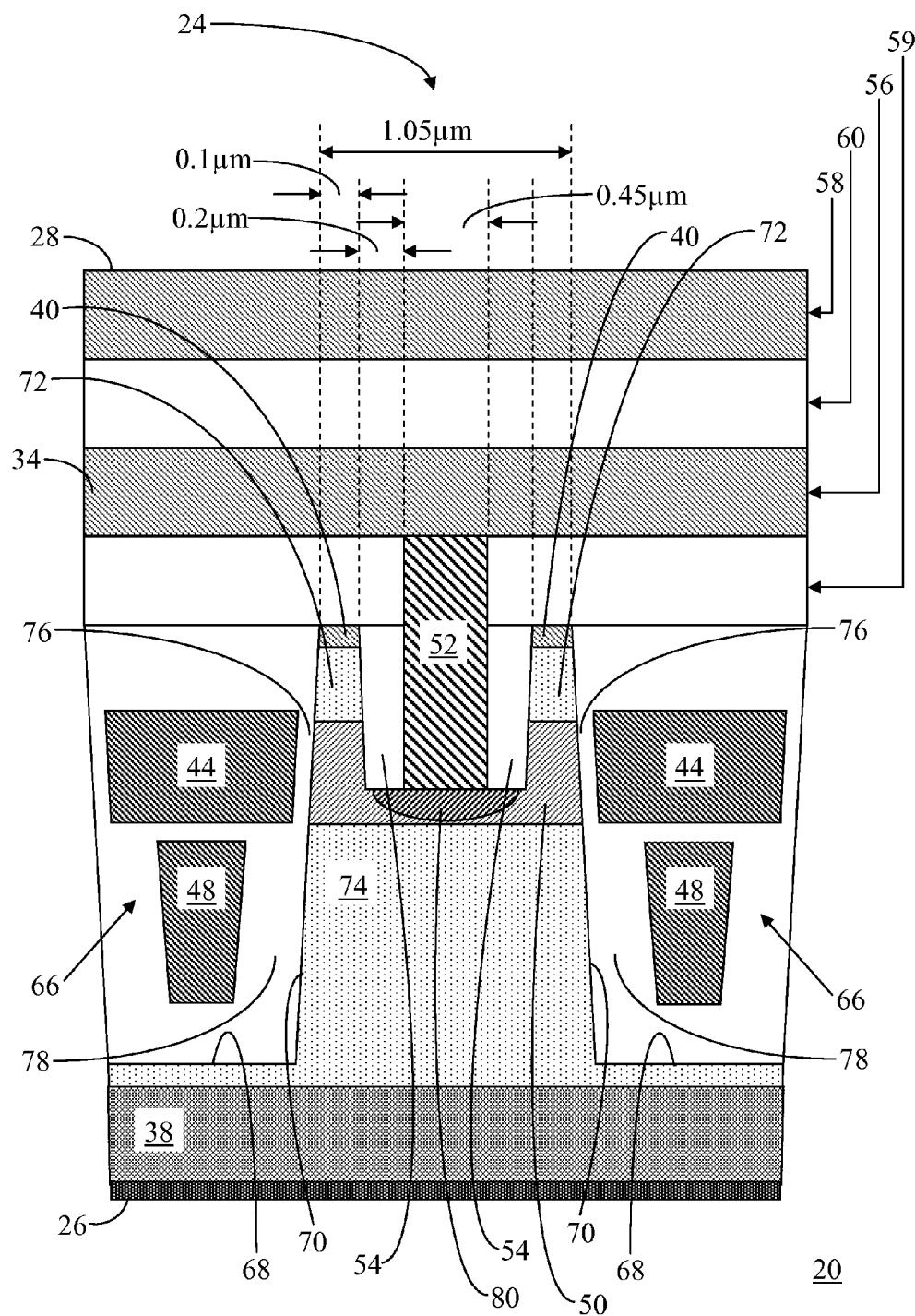
FIG. 4 shows an enlarged simplified side sectional view of a portion of the bidirectional trench FET device.

Referring now to FIG. 4, FIG. 4 shows an enlarged simplified side sectional view of a portion of bidirectional trench FET device 20. More particularly, FIG. 4 shows one of transistors 24 that includes upper and lower drift regions 72, 74 and body region 50 interposed between a pair of trenches 66, where each trench 66 includes gate 44 surrounded by gate dielectric layer 76 and shield 48 surrounded by shield dielectric layer 78. Transistor 24 further includes body contact plug 52 in accordance with an embodiment. As shown, body contact plug 52 is surrounded by dielectric lining 54. Body contact plug 56 extends from body electrode 34 in first metal layer 56, through a dielectric layer, i.e., first ILD 59, source region 40, upper drift region 72, and to dopant region 80 in body region 50. Dielectric lining 54 electrically isolates body contact plug 52 from source region 40 and from upper drift region 72.

FIG. 4 further provides exemplary device dimensions that enable the use of body contact plug 52 surrounded by dielectric lining 54. By way of example, the width between trenches 66 may be 1.05 microns and the body contact plug 52 may be approximately 0.45 microns. Dielectric lining 54 surrounding body contact plug may be 0.2 microns thick. Therefore, a thickness of the remaining source region 40 on opposing sides of dielectric lining 54 may be 0.1 microns thick. However, other thicknesses may be used.

Figure 5:
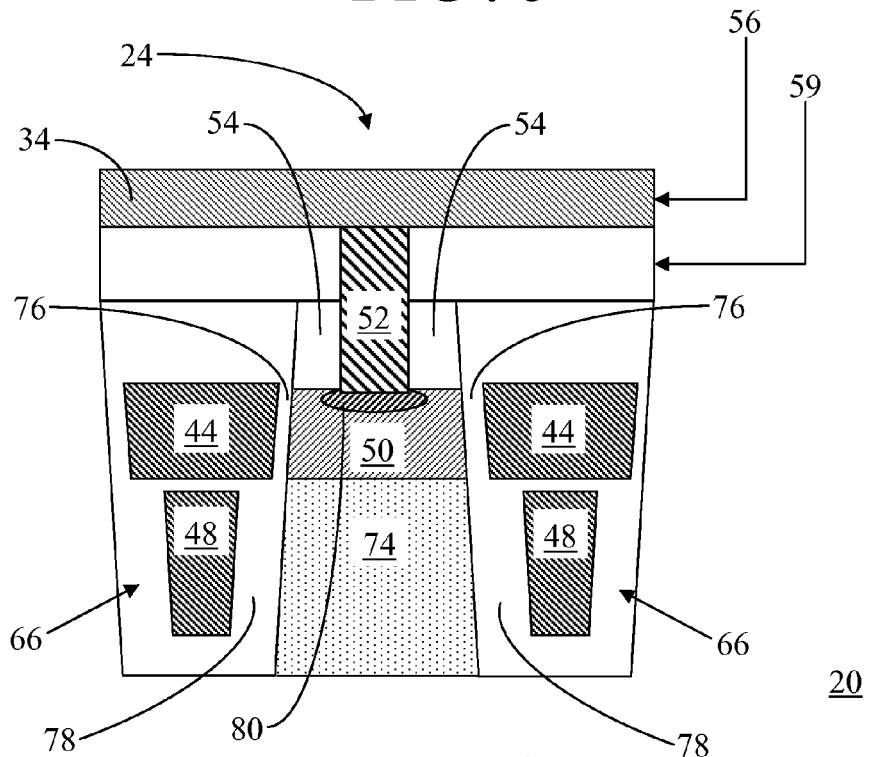
FIG. 5 shows an enlarged simplified side sectional view of a portion of the bidirectional trench FET device in accordance with an alternative embodiment.

FIG. 5 shows an enlarged simplified side sectional view of a portion of bidirectional trench FET device 20 in accordance with an alternative embodiment. More particularly, FIG. 5 shows one of transistors 24 that includes lower drift region 74 and body region 50 interposed between a pair of trenches 66, where each trench 66 includes gate 44 surrounded by gate dielectric layer 76 and shield 48 surrounded by shield dielectric layer 78. Transistor 24 further includes body contact plug 52 surrounded by dielectric lining 54 in accordance with another embodiment. Source region 38, source electrode 26, second ILD 60, and second metal layer 58 (all of which are provided in FIG. 4) are not shown in FIG. 5 for simplicity.

In this example, the spacing between trenches 66 may be too narrow to accommodate both dielectric lining 54 (FIG. 5) and the N-type epitaxial layer of upper drift region 72 (FIG. 2). Accordingly, in this alternative embodiment, the placement of body contact plug 52 is alternated with the placement of source region 40. That is, body contact plug 52 will be positioned between trenches 66 at locations where source region 40 is not present. Conversely, source region 40 (not shown) will be positioned between trenches 66 at locations where body contact plug 52 is not present. Thus, body contact plug 52 can extend from body electrode 34 in first metal layer 56 through first ILD 59 and through dielectric lining 54 while remaining electrically isolated from source region 40.

Figure 6:
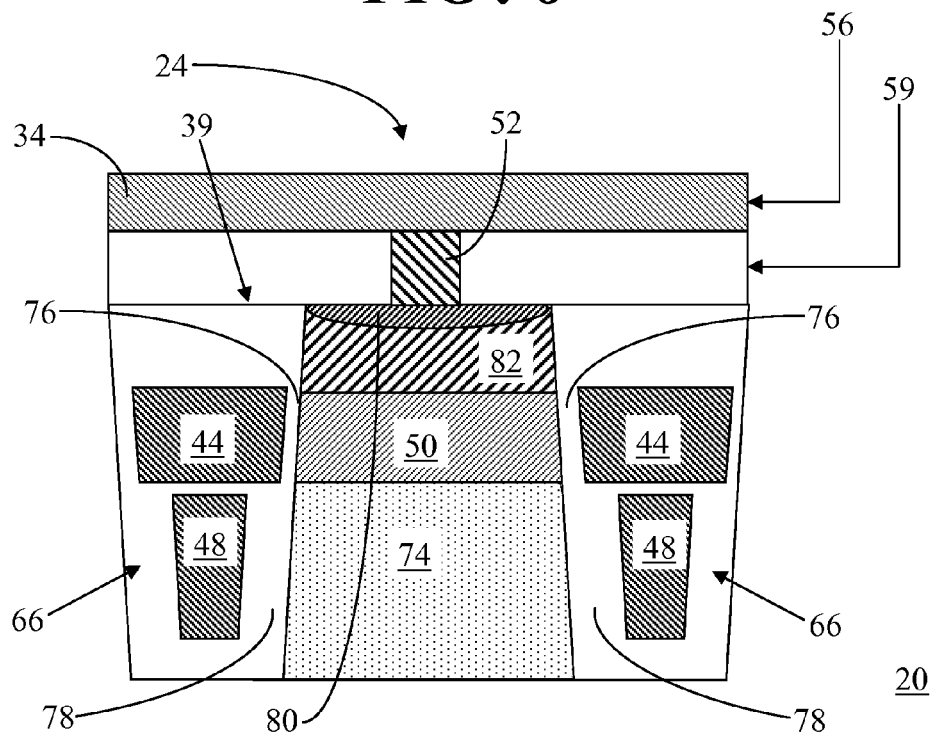
FIG. 6 shows an enlarged simplified side sectional view of a portion of the bidirectional trench FET device in accordance with another alternative embodiment.

FIG. 6 shows an enlarged simplified side sectional view of a portion of bidirectional trench FET device 20 in accordance with another alternative embodiment. More particularly, FIG. 6 shows one of transistors 24 interposed between a pair of trenches 66, where each trench 66 includes gate 44 surrounded by gate dielectric layer 76 and shield 48 surrounded by shield dielectric layer 78. Additionally, transistor 24 includes lower drift region 74, but does not include upper drift region 72. When body region 50 is a P-region, a P-link 82 may be disposed between body region 50 and top surface 39 of semiconductor substrate 22, without source region 40 (FIG. 4). Thus, body contact plug 52 will extend from body electrode 34 of first metal layer 56, through first ILD 59, to dopant region 80 in P-link 82. Source region 38, source electrode 26, second ILD 60, and second metal layer 58 (all of which are provided in FIG. 4) are not shown in FIG. 6 for simplicity.

Figure 7:
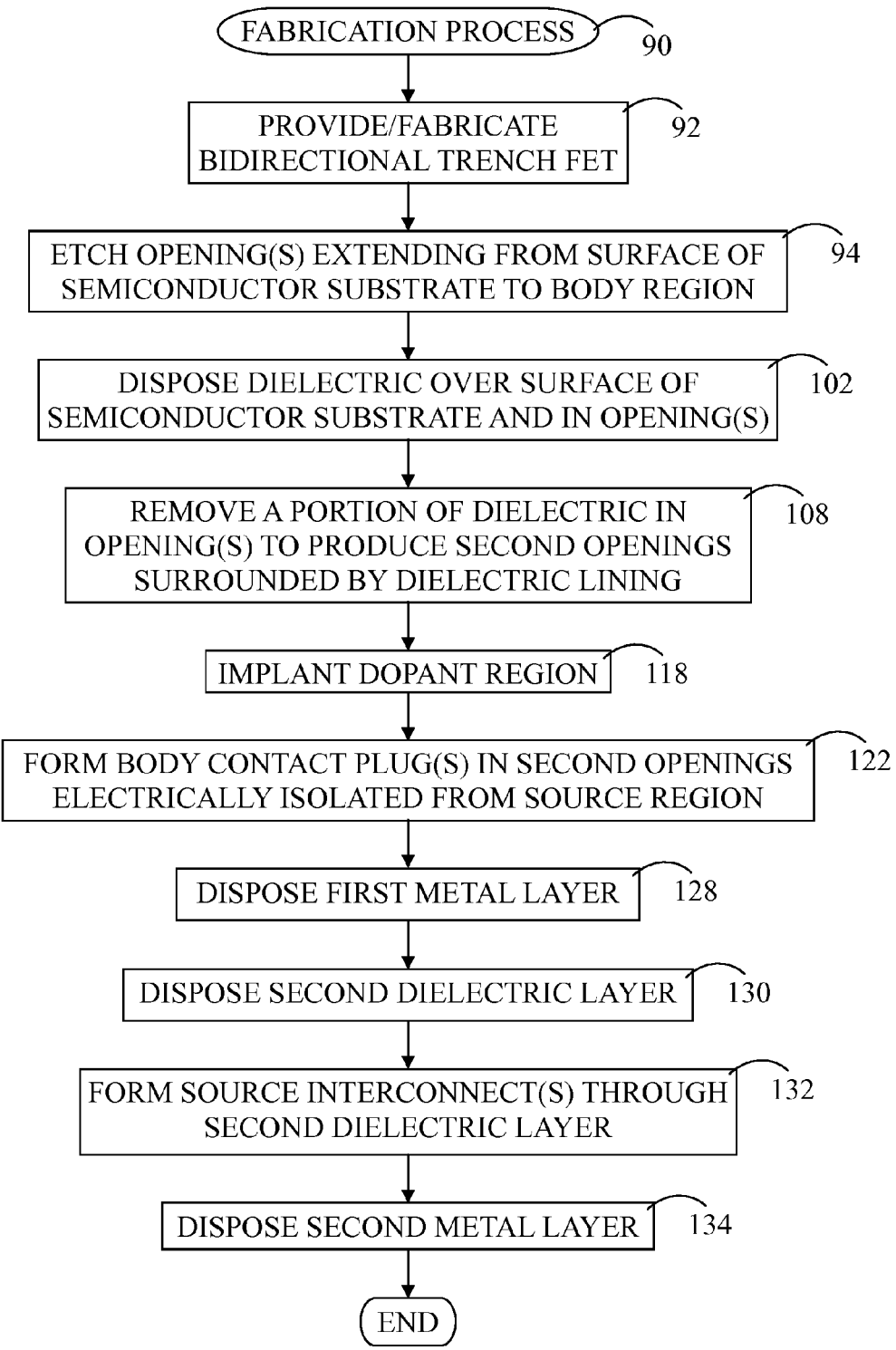
FIG. 7 shows a flowchart of a fabrication process in accordance with another embodiment.

FIG. 7 shows a flowchart of a fabrication process 90 in accordance with another embodiment. Fabrication process 90 may be executed in order to produce bidirectional trench FET device 20 (FIG. 1) that includes body contact plugs 52 and the separate metal layers 56, 58 in which body electrode 34 and source electrode 28 are separately formed.

Fabrication process 90 provides a generalized description of the operations, subdivided into process blocks, that are performed to produce bidirectional trench FET device 20 (FIG. 1) that includes body contact plugs 52 and the separate metal layers 56, 58 in which body electrode 34 and source electrode 28 are separately formed. A number of pretreatment operations and suboperations known to those skilled in the art are not listed for brevity. Additionally, fabrication process 90 is described in the context of fabricating a single body contact plug 92. It should be understood that fabrication process 90 may be executed to concurrently form a plurality of body contact plugs 52 for a single bidirectional trench FET device 20 and/or as a wafer level fabrication process to concurrently produce a plurality of bidirectional trench FET device 20 having one or more body contact plugs 52.

The various process blocks of fabrication process 90 are discussed in connection with the subsequent FIGS. 8-13. Therefore, fabrication process 90 should be viewed concurrently with the corresponding descriptions of FIGS. 8-13 when suggested. Additionally, the views presented in FIGS. 8-13 correspond to an enlarged simplified sectional view of the portion of bidirectional trench FET device 20. Of course, it should be readily apparent to those skilled in the art that fabrication of bidirectional trench FET device 20 entails fabrication of the entire bidirectional trench FET device 20 and not just the portion shown in FIGS. 8-13.

At a block 92 of fabrication process 90, bidirectional trench FET 20 (without body contact plugs 52 and the overlying metal layers 56 and 58) is fabricated or otherwise provided. At block 92, fabrication of bidirectional trench FET 20 may entail forming a drain on an original semiconductor substrate, forming an n-type epitaxial layer on the original substrate, defining one or more body regions, defining one or more drift regions, forming one or more source regions, forming trenches, forming shields and gates in the trenches, and depositing the shield and gate dielectric layers. For brevity, the details of the above fabrication subtasks are not described in detail herein.

Figure 8:
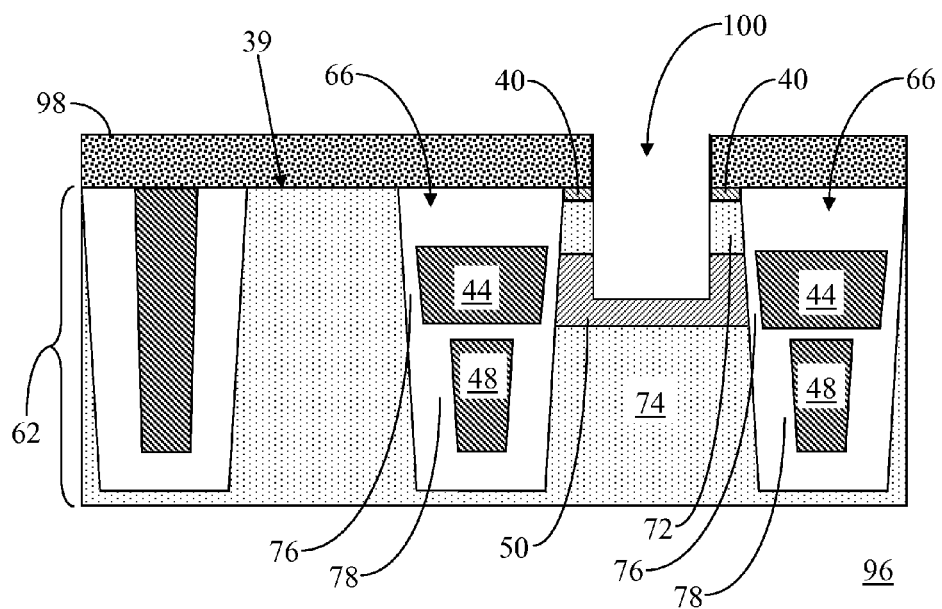
FIG. 8 shows a side sectional view of a structure at an initial stage of fabrication in accordance with the process of FIG. 7.

At a block 94 of fabrication process 90, openings are etched extending from the top surface of the semiconductor substrate to the body region. Referring to FIG. 8 in connection with block 94, FIG. 8 shows a simplified side sectional view of a structure at an initial stage 96 of fabrication in accordance with fabrication process 90. The structure of FIG. 8 includes epitaxial layer 62 in which trenches 66 are formed. The structure further includes gates 44 and shields 48, surrounded by gate dielectric layer 76 and shield dielectric layer 78, in trenches 66. Epitaxial layer 62 includes body region 50 interposed between upper and lower drift regions 72, 74 and source region 40 formed on upper drift region 72. Drain region 38 and drain electrode 26 (FIG. 2) are not shown for simplicity. Additionally, a dielectric layer to passivate top surface 39 is not shown for simplicity.

As shown in FIG. 8, top surface 39 is suitably protected by a hard mask 98, e.g., a tetraethyl orthosilicate (TEOS) hard mask. Epitaxial layer 62 may then be etched to the desired depth to form an opening 100 extending through source region 40, upper drift region 72, and a portion of body region 50. Etching may entail any known suitable technique.

Figure 9:
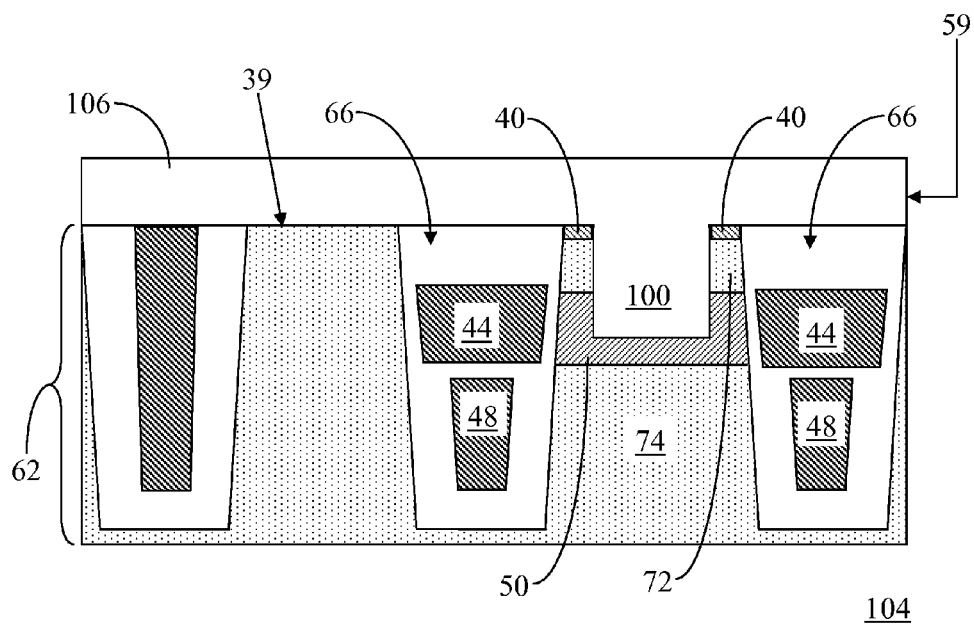
FIG. 9 shows a side sectional view of the structure of FIG. 8 at a subsequent stage of fabrication.

Fabrication process 90 continues at a block 102. At block 102, a dielectric material may be deposited over top surface 39 and in opening 100. Referring to FIG. 9 in connection with block 102, FIG. 9 shows a simplified side sectional view of the structure of FIG. 8 at a subsequent stage 104 of fabrication. As shown, a dielectric material 106, such as TEOS, is deposited over top surface 39 and fills opening 100. In this example, the deposited dielectric material 106 is first ILD 59.

Figure 10:
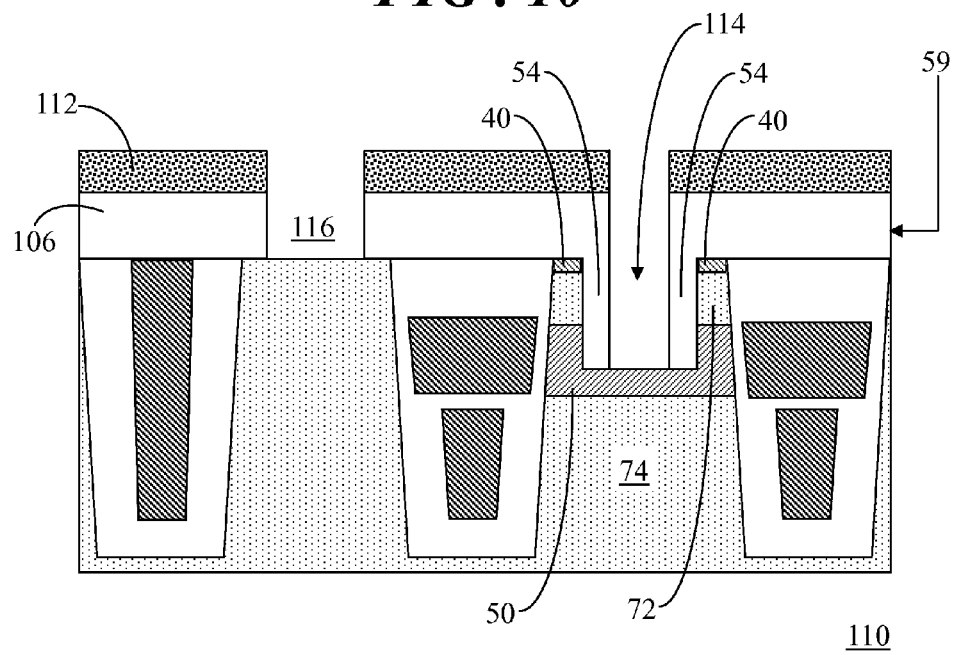
FIG. 10 shows a side sectional view of the structure of FIG. 9 at a subsequent stage of fabrication.

Fabrication process 90 continues at a block 108. At block 108, a portion of the dielectric material filling the opening(s) is removed to produce second opening(s) surrounded by the dielectric material. Referring to FIG. 10 in connection with block 108, FIG. 10 shows a simplified side sectional view of the structure of FIG. 9 at a subsequent stage 110 of fabrication. As shown in FIG. 10, dielectric material 106 of first ILD 59 is suitably protected by a hard mask 112. Dielectric material 106 may then be etched such that a portion of dielectric material 106 present in opening 100 (FIG. 9) is etched or otherwise removed to produce a second opening 114 to body region 50 that is surrounded by dielectric lining 54. Dielectric lining 54 is thus interposed between source region 40 and second opening 114. Dielectric material 106 may be etched at other locations to form additional openings 116 in accordance with a particular device design.

Figure 11:
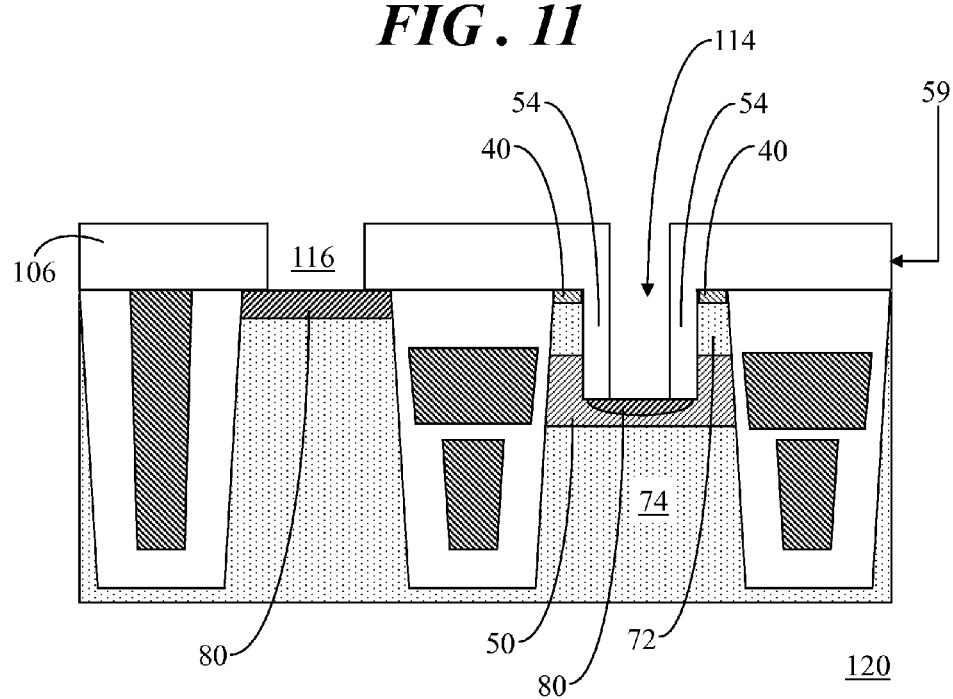
FIG. 11 shows a side sectional view of the structure of FIG. 10 at a subsequent stage of fabrication.

Fabrication process 90 continues at a block 118. At block 118, the dopant region is implanted at the bottom of the second opening. Referring to FIG. 11 in connection with block 118, FIG. 11 shows a simplified side sectional view of the structure of FIG. 10 at a subsequent stage 120 of fabrication. As shown in FIG. 11, dopant region 80 may be implanted at the bottom of each of openings 114 and 116. For example, when body region 50 is a P-region, implantation and activation of a P+ dopant, such as boron, may be performed.

Figure 12:
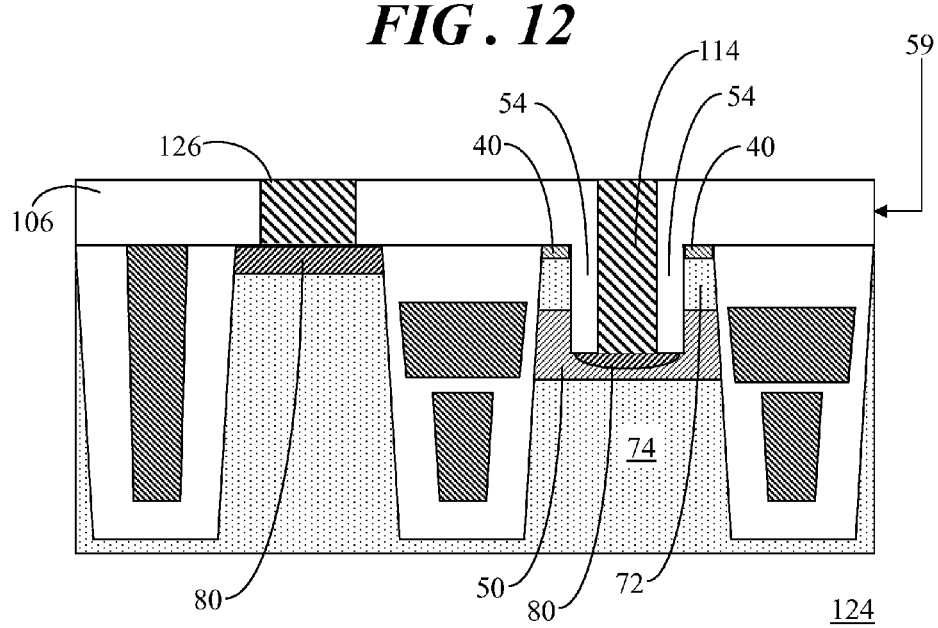
FIG. 12 shows a side sectional view of the structure of FIG. 11 at a subsequent stage of fabrication.

Fabrication process 90 continues at a block 122. At block 122, the body contact plugs are formed in the second openings. Referring to FIG. 12 in connection with block 122, FIG. 12 shows a simplified side sectional view of the structure of FIG. 11 at a subsequent stage 124 of fabrication. As shown in FIG. 12, material such as tungsten, polysilicon, doped polysilicon and the like is deposited in opening 114 (FIG. 11) to form body contact plug 52. Body contact plug 52 is in contact with dopant region 80 and hence with body region 50. However, body contact plug 52 is electrically isolated from source region 40 via dielectric lining 54. This same material (e.g., tungsten, polysilicon, doped polysilicon and the like) may additionally be deposited in other openings 116 (FIG. 11) in accordance with a particular design to form other interconnects 126.

Fabrication process 90 continues at a block 128. At block 128, the first metal layer is suitably disposed over first interlayer dielectric. Next at a block 130, the second interlayer dielectric is disposed over the first metal layer. At a block 132, the source interconnects may be formed through the second dielectric layer, and at a block 134, the second metal layer is suitably disposed over the second dielectric layer. Thereafter, fabrication process 90 ends. Of course, additional operations may be implemented at various points during the execution of fabrication process 90 that are not shown for simplicity.

Figure 13:
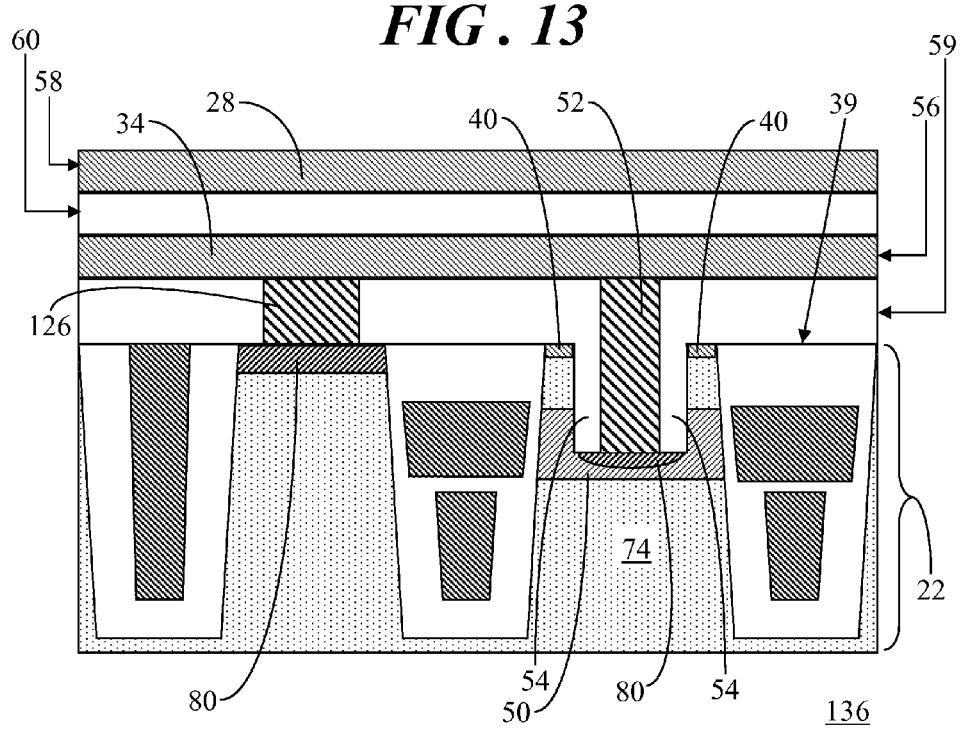
FIG. 13 shows a side sectional view of the structure of FIG. 12 at a subsequent stage of fabrication.

Now referring to FIGS. 3 and 13 in connection with blocks 128, 130, 132, and 134 of fabrication process 90, FIG. 13 shows a simplified side sectional view of the structure of FIG. 12 at a subsequent stage 136 of fabrication. As shown in FIG. 13, first metal layer 56 is suitably disposed (block 128) on first ILD 59 to produce body electrode 34 in electrical contact with body contact plug 52, and optionally, in electrical contact with interconnect 126. Thereafter, second ILD 60 is suitably disposed (block 130) over first metal layer 56 and any exposed regions of top surface 39 of semiconductor substrate 22, as particularly illustrated in FIG. 3. Source interconnects 42 can then be formed (block 132) extending through second ILD 60 as shown in FIG. 3. Source interconnects 42 can be formed by etching openings extending through second ILD 60 to source regions 40 and thereafter filling the openings with an electrically conductive material such as tungsten, polysilicon, doped polysilicon, and the like. Next, second metal layer 58 is suitably disposed (block 134) on second ILD 60 and source interconnects 42 to produce source electrode 28 in electrical contact with source interconnects 42, and thus in electrical contact with source region 40. Of course, since source interconnects 42 extend through second ILD 60, they are electrically isolated from body electrode 34 and body contact plugs 52.

It is to be understood that certain ones of the process blocks depicted in FIG. 7 may be performed in parallel with each other or with performing other processes. In addition, it is to be understood that the particular ordering of the process blocks depicted in FIG. 7 may be modified, while achieving substantially the same result. Accordingly, such modifications are intended to be included within the scope of the inventive subject matter.

Thus, a bidirectional trench FET device having at least one body contact plug and two metal layers and a method for fabricating the bidirectional trench FET device have been described. An embodiment of the bidirectional trench FET device comprises a semiconductor substrate having a surface, a trench in the semiconductor substrate extending vertically from the surface, and a body region disposed in the semiconductor substrate and laterally adjacent to the trench. The body region is spaced from the surface and has a first conductivity type. A source region is disposed at the surface of the semiconductor substrate between the body region and the surface. A dielectric layer is disposed over the surface of the semiconductor substrate. A body electrode disposed over the dielectric layer, and a body contact plug extends through the dielectric layer. The body contact plug interconnects the body region with the body electrode, and the body contact plug is electrically isolated from the source region.

An embodiment of a method of fabricating a bidirectional trench field effect transistor (FET) device having suppressed bipolar snapback, the bidirectional trench FET including a semiconductor substrate having a surface, a trench in the semiconductor substrate extending vertically from the surface, a body region disposed in the semiconductor substrate and laterally adjacent to the trench, the body region being spaced from the surface and having a first conductivity type, and a source region disposed at the surface of the semiconductor substrate between the body region and the surface, and the method comprising disposing a dielectric layer over the surface of the semiconductor substrate, disposing a body electrode over the dielectric layer, forming a body contact plug extending through the dielectric layer to interconnect the body region with the body electrode, and electrically isolating the body contact plug from the source region.

The devices and processes, discussed above, and the inventive principles thereof are intended to suppress bipolar snapback in a bidirectional trench FET device. The bidirectional trench FET device includes one or more body contact plugs formed from, for example, tungsten, that make contact between a body region of the device and a body electrode. The body contact plug functions to remove holes generated by reverse biased avalanche from the body/drain junction. The body contact plug may be surrounded by a dielectric lining. The dielectric lining isolates the body contact plug from a source region of the bidirectional trench FET device. Isolation of the body contact plug from the source enables bidirectional switching. In addition, the bidirectional trench FET device includes two separate metal layers in order to make multiple body and source contacts separately throughout the active area of the bidirectional trench FET device. The low resistive paths formed by the body contact plugs to the metal body layer enables suppression of the bipolar snapback and isolation of the body metal contact from the source contact maintains the bidirectional switching capability.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A bidirectional trench field effect transistor (FET) device comprising:
    a semiconductor substrate having a surface;
    a trench in said semiconductor substrate extending vertically from said surface;
    a body region disposed in said semiconductor substrate and laterally adjacent to said trench, said body region being spaced from said surface and having a first conductivity type;
    a source region disposed at said surface of said semiconductor substrate between said body region and said surface;
    a dielectric layer disposed over said surface of said semiconductor substrate;
    a body electrode disposed over said dielectric layer; and
    a body contact plug extending through said dielectric layer, said body contact plug interconnecting said body region with said body electrode, and said body contact plug being electrically isolated from said source region.

2. The bidirectional trench FET device of claim 1 wherein said body contact plug further extends through said source region, and said bidirectional trench FET further comprises a dielectric lining surrounding said body contact plug extending through said source region to electrically isolate said body contact plug from said source region.

3. The bidirectional trench FET device of claim 1 further comprising a drift region disposed in said semiconductor substrate between said body region and said source region, said drift region having a second conductivity type, wherein said body contact plug additionally extends through said drift region to interconnect said body region with said body electrode.

4. The bidirectional trench FET device of claim 1 further comprising a dopant region disposed between said body contact plug and said body region.

5. The bidirectional trench FET device of claim 4 wherein said body region comprises a P-region, said body contact plug extends to said body region, and said dopant region comprises a P+ region.

6. The bidirectional trench FET device of claim 1 wherein:
    said body region comprises a P-region; and
    said bidirectional trench FET device further comprises a P-link region disposed in said semiconductor substrate between said body region and said surface of said semiconductor substrate, said P-link region being electrically isolated from said source region and said body contact plug extending to said P-link region.

7. The bidirectional trench FET device of claim 1 wherein said dielectric layer is a first dielectric layer, and said bidirectional trench FET device further comprises:
    a source electrode vertically disposed away from said body electrode; and
    a source interconnect interconnecting said source region with said source electrode, wherein said source electrode and said source interconnect are electrically isolated from said body electrode.

8. The bidirectional trench FET device of claim 7 wherein said source interconnect is electrically isolated from said body contact plug.

9. The bidirectional trench FET device of claim 1 wherein said body contact plug comprises a tungsten contact plug.

10. The bidirectional trench FET device of claim 1 wherein said body contact plug comprises a polysilicon contact plug.

11. The bidirectional trench FET device of claim 1 wherein said body contact plug comprises a doped polysilicon contact plug.

12. A bidirectional trench field effect transistor (FET) device comprising:
    a semiconductor substrate having a surface;
    a trench in said semiconductor substrate extending vertically from said surface;
    a body region disposed in said semiconductor substrate and laterally adjacent to said trench, said body region being spaced from said surface and having a first conductivity type;
    a source region disposed at said surface of said semiconductor substrate between said body region and said surface;
    a dielectric layer disposed over said surface of said semiconductor substrate;
    a body electrode disposed over said dielectric layer;
    a body contact plug extending through said dielectric layer and said source region, said body contact plug interconnecting said body region with said body electrode;
    a dielectric lining surrounding said body contact plug, said dielectric lining electrically isolating said body contact plug from said source region;
    a source electrode vertically disposed away from said body electrode; and
    a source interconnect interconnecting said source region with said source electrode, wherein said source electrode and said source interconnect are electrically isolated from said body electrode.

13. The bidirectional trench FET device of claim 12 wherein said source interconnect is electrically isolated from said body contact plug.

14. The bidirectional trench FET device of claim 12 further comprising a dopant region disposed between said body contact plug and said body region, said dopant region being electrically isolated from said source region via said dielectric lining.

15. The bidirectional trench FET device of claim 14 wherein said body region comprises a P-region, said body contact plug extends to said body region, and said dopant region comprises a P+ region.

16. The bidirectional trench FET device of claim 12 wherein:
    said body region comprises a P-region; and
    said bidirectional trench FET device further comprises a P-link region disposed in said semiconductor substrate between said body region and said surface of said semiconductor substrate, said P-link region being electrically isolated from said source region, wherein said body contact plug extends to said P-link region.

17. A method of fabricating a bidirectional trench field effect transistor (FET) device having suppressed bipolar snapback, said bidirectional trench FET including a semiconductor substrate having a surface, a trench in said semiconductor substrate extending vertically from said surface, a body region disposed in said semiconductor substrate and laterally adjacent to said trench, said body region being spaced from said surface and having a first conductivity type, and a source region disposed at said surface of said semiconductor substrate between said body region and said surface, and said method comprising:

disposing a dielectric layer over said surface of said semiconductor substrate;

disposing a body electrode over said dielectric layer;

forming a body contact plug extending through said dielectric layer to interconnect said body region with said body electrode; and electrically isolating said body contact plug from said source region.

18. The method of claim 17 wherein a drift region is interposed between said body region and said source region, and said method further comprises:

prior to said disposing said dielectric layer, etching an opening extending from said surface of said semiconductor substrate through said source region, said drift region, and said body region, wherein said disposing said dielectric layer fills said opening with said dielectric layer;

removing a portion of said dielectric layer within said opening to expose said body region while concurrently leaving a remaining portion of said dielectric layer intact on sidewalls of said opening, said removing producing a second opening surrounded by said remaining portion of said dielectric layer; and said forming said body contact plug includes depositing a plug material in said second opening, said remaining portion of said dielectric layer forming a dielectric lining surrounding said body contact plug and electrically isolating said body contact plug from said source region.

19. The method of claim 18 further comprising implanting a dopant region between said body contact plug and said body region, said dopant region being electrically isolated from said source region via said dielectric lining, wherein said body region comprises a P-region and said dopant region comprises a P+ region.

20. The method of claim 17 further comprising wherein said dielectric layer is a first dielectric layer, and said method further comprises:

disposing a second dielectric layer over said body electrode and said source region;

disposing a source electrode over said second dielectric layer, wherein said second dielectric layer electrically isolates said body electrode from said source electrode; and forming a source interconnect extending through said second dielectric layer and interconnecting said source region with said source electrode, wherein said source interconnect is electrically isolated from said body contact plug.

\* \* \* \* \*